(12) United States Patent
Zeng et al.

(10) Patent No.: US 10,826,134 B2
(45) Date of Patent: Nov. 3, 2020

(54) BATTERY MODULE

(71) Applicant: Contemporary Amperex Technology Co., Limited, Ningde, Fujian (CN)

(72) Inventors: Xin Zeng, Ningde (CN); Sien Chen, Ningde (CN); Kaiqin Yu, Ningde (CN); Shoujiang Xu, Ningde (CN); Chunyan Feng, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 168 days.

(21) Appl. No.: 16/115,137

(22) Filed: Aug. 28, 2018

(65) Prior Publication Data

US 2019/0386349 A1    Dec. 19, 2019

(30) Foreign Application Priority Data

Jun. 15, 2018    (CN) .......................... 2018 1 0622668

(51) Int. Cl.
*H01M 10/42* (2006.01)
*H01M 2/10* (2006.01)
(Continued)

(52) U.S. Cl.
CPC ....... *H01M 10/425* (2013.01); *H01M 2/1016* (2013.01); *H01M 2/202* (2013.01);
(Continued)

(58) Field of Classification Search
CPC ............. H01M 10/425; H01M 10/482; H01M 2010/4271; H01M 2200/103;
(Continued)

(56) References Cited

U.S. PATENT DOCUMENTS

2009/0246615 A1    10/2009 Park
2012/0052331 A1    3/2012 Park
(Continued)

FOREIGN PATENT DOCUMENTS

CN    104282870 A    1/2015
CN    106489214 A    3/2017
(Continued)

OTHER PUBLICATIONS

Translation JP2014120417(A) (Year: 2014).*
The extended European search report dated Nov. 6, 2018 for European application No. 18191809.5, 7 pages.

*Primary Examiner* — Victoria H Lynch
(74) *Attorney, Agent, or Firm* — Law Offices of Liaoteng Wang (57) ABSTRACT

The present disclosure relates to a battery module comprising: a plurality of single cells arranged in sequence; a sampling circuit board disposed opposite to a top of the single cells and provided with a conductive hole and a conductive sleeve disposed in the conductive hole; and a busbar having a connecting plate and a conductive post extending from the connecting plate, and the connecting plate being connected to the single cells, wherein the busbar is electrically connected to the sampling circuit board by insertion of the conductive post into the conductive sleeve. The battery module according to embodiments of the present disclosure includes a busbar and a sampling circuit board electrically connected with each other, which have a stable and reliable connection and a high impact resistance ability, thereby improving an operational reliability and safety of the battery module.

11 Claims, 5 Drawing Sheets

(51) Int. Cl.
*H01M 2/20* (2006.01)
*H05K 1/11* (2006.01)

(52) U.S. Cl.
CPC ..... *H05K 1/115* (2013.01); *H01M 2010/4271* (2013.01); *H05K 2201/10037* (2013.01); *H05K 2201/10272* (2013.01); *H05K 2201/10295* (2013.01)

(58) Field of Classification Search
CPC ........... H01M 2220/20; H01M 2/1016; H01M 2/202; H01M 2/206; H05K 1/115; H05K 2201/10037; H05K 2201/10272; H05K 2201/10295
See application file for complete search history.

(56) References Cited

U.S. PATENT DOCUMENTS

| | | |
|---|---|---|
| 2014/0127554 A1 | 5/2014 | Fukuda et al. |
| 2015/0017484 A1 | 1/2015 | Ahn et al. |
| 2017/0352852 A1 | 12/2017 | Son et al. |

FOREIGN PATENT DOCUMENTS

| | | |
|---|---|---|
| EP | 2424006 A1 | 2/2012 |
| JP | 2009163932 A | 7/2009 |
| JP | 2014120417 A | 6/2014 |
| KR | 20170067007 A | 6/2017 |

\* cited by examiner

BATTERY MODULE

CROSS REFERENCE

This application claims priority to Chinese Patent Application No. 201810622668.8, filed on Jun. 15, 2018, which is hereby incorporated by reference in its entirety.

TECHNICAL FIELD

The present disclosure relates to a technical filed of battery, and particularly to a battery module.

BACKGROUND

With a development of science and technology, a secondary battery has begun to be widely used in the field of automobiles. During the entire life cycle of an electric vehicle, a battery management system has to monitor important physical parameters, such as voltage and temperature, of each secondary battery in the battery module in real time, and evaluate and calculate a situation of all secondary batteries in the battery pack by using these physical parameters as an important basis, so as to prevent overcharge and over discharge to ensure a lifetime and safety of the battery system, and make corresponding adjustment strategies. The battery management system monitors the secondary battery by means of a sampling connection structure. During the use of the sampling connection structure, due to a number of factors, such as automobile vibration and high-voltage discharge, an overload fuse failure, mechanical connection failure, or physical contact wear and rupture, which may lead to an external short-circuit of the secondary battery, resulting in thermal runaway, may occur to the sampling connection, reducing a reliability and safety of the entire vehicle operation of electric vehicles and thus imposing a great negative impact on a sustainable development of an electric vehicle market.

Currently, a pin is directly provided on the busbar, and a hole is provided in the sampling circuit board. The sampling connection in the battery module is achieved by directly inserting the pin of the bus bar into the hole provided in the sampling circuit board so that the pin is electrically connected to the sampling circuit board. However, since the sampling circuit board includes a conductive layer having a small thickness and an outer insulating layer encasing the conductive layer, in the state that the pin of the busbar is inserted into the hole of the sampling circuit board, only a small contact area can be formed between the entire pin and the conductive layer, and the contact area is less than or equal to an area of the conductive layer exposed within the hole. Thus, the contact area between the busbar and the sampling circuit board is small, resulting in that a stable contact between the pin of the busbar and the conductive layer of the circuit board cannot be ensured. When the battery module vibrates, an unstable connection or even disconnection between the pin of the busbar and the conductive layer of the sampling circuit board may occur, resulting in inaccurate sampling data or loss of data, which seriously affects an operational reliability and safety of the battery module during usage.

SUMMARY

The battery module of an embodiment of the disclosure includes a busbar and a sampling circuit board electrically connected with each other, connection of which is stable, reliable and has a high impact resistant ability, and thus operational reliability and safety of the battery module can be improved.

On one aspect, the present disclosure is provided with a battery module, wherein, comprising:
  a plurality of single cells arranged in sequence;
  a sampling circuit board disposed opposite to a top of the single cells and provided with a conductive hole and a conductive sleeve disposed in the conductive hole; and
  a busbar having a connecting plate and a conductive post extending from the connecting plate, and the connecting plate being connected to the single cells,
  wherein the busbar is electrically connected to the sampling circuit board by insertion of the conductive post into the conductive sleeve.

According to one embodiment of the present disclosure, a filler gap is formed between an outer peripheral surface of the conductive post and an inner wall of the conductive sleeve, and the battery module further comprises a soldered body formed by solder, wherein at least a portion of the soldered body is provided in the filler gap, and the conductive post and the conductive sleeve are connected with each other by the soldered body.

According to one embodiment of the present disclosure, a dimension of the filler gap in a radial direction of the conductive sleeve is in a range of 0.1 mm to 0.5 mm.

According to one embodiment of the present disclosure, the soldered body is configured to occupy at least 75% of the filler gap in an axial direction of the conductive sleeve.

According to one embodiment of the present disclosure, the sampling circuit board further comprises an annular body located at an end of the conductive sleeve, wherein the annular body is disposed on a surface of the sampling circuit board facing the single cells and is provided to surround the conductive hole, the soldered body comprises a sleeve portion disposed in the filler gap and an annular flange provided on the sleeve portion, and the annular flange is laminated with the annular body.

According to one embodiment of the present disclosure, the conductive sleeve has a wall thickness greater than or equal to 0.025 mm and less than or equal to 1 mm.

According to one embodiment of the present disclosure, the conductive sleeve is made of copper or a copper alloy.

According to one embodiment of the present disclosure, a free end of the conductive post away from the connecting plate protrudes beyond a surface of the sampling circuit board.

According to one embodiment of the present disclosure, the connecting plate is disposed above the sampling circuit board, and the conductive post is inserted into the conductive sleeve from top to bottom.

According to one embodiment of the present disclosure, the conductive post is formed in a shape of prism, and has a top end surface and a guiding bevel in connection and intersecting with the top end surface.

The conductive post included in the busbar of the present disclosure is directly electrically connected to the conductive sleeve of the sampling circuit board. In this way, a contact area between the conductive post and the conductive sleeve is large and a contact between them is tight, so that an offset or separation between the conductive post and the conductive sleeve is less likely to occur, stability of connection between the conductive post and the conductive sleeve can be improved, stability of an electrical connection between the busbar and the sampling circuit board can be effectively ensured, and a possibility of unstable connection or open circuit between the busbar and the sampling circuit board can be reduced.

BRIEF DESCRIPTION OF THE DRAWINGS

Features, advantages, and technical effects of exemplary embodiments of the present disclosure will be described below with reference to accompanying drawings.

In the drawings, the drawings are not drawn to scale.

DESCRIPTION OF REFERENCE SIGNS

100 Battery module;
110 Single cell;
120 Busbar;
121 Connecting plate;
121a Body portion;
121b Cantilever portion;
122 Conductive post;
122a Top end surface;
122b Guiding bevel;
123 Groove;
130 Sampling circuit board;
130a Conductive layer;
130b External insulating layer;
131 Conductive hole;
132 Conductive sleeve;
133 Annular body;
140 Soldered body;
141 Sleeve portion;
142 Annular flange;
150 Fuse component;
Filler gap;
X Width direction;
Y Extension direction.

DETAILED DESCRIPTION

Below, embodiments of the present disclosure will be further described in detail with reference to the drawings and embodiments. The detailed description of the embodiments and the accompanying drawings are intended to exemplary illustrate the principles of the present disclosure and are not intended to limit the scope of the present disclosure. That is, the present disclosure is not limited to the described embodiments.

In the description of the present disclosure, it should be noted that, unless otherwise stated, the meaning of "a plurality" is two or more; the orientation or positional relationship indicated by the terms "upper", "lower", "left", "right" and the like is merely for the purpose of describing the present disclosure and simplifying the description, and is not intended to indicate or imply that the device or component referred to has a particular orientation, is constructed and operated in a particular orientation, and therefore cannot be understood to be a limitation of the present disclosure. Moreover, the terms "first", "second", and the like are used for descriptive purposes only and are not to be construed as indicating or implying relative importance.

In the description of the present disclosure, it should be noted that, unless otherwise stated, the terms "installation", "connected to", and "connected with" are to be understood broadly, and may be, for example, a fixed connection, a disassemble connection, or an integral connection; they can be connected directly or indirectly through an intermediate medium. The specific meaning of the above terms in the present disclosure can be understood by the person skilled in the art according to actual circumstance.

For better understanding the present disclosure, a battery module 100 according to an embodiment of the present disclosure will be described in detail below.

Figure 1:
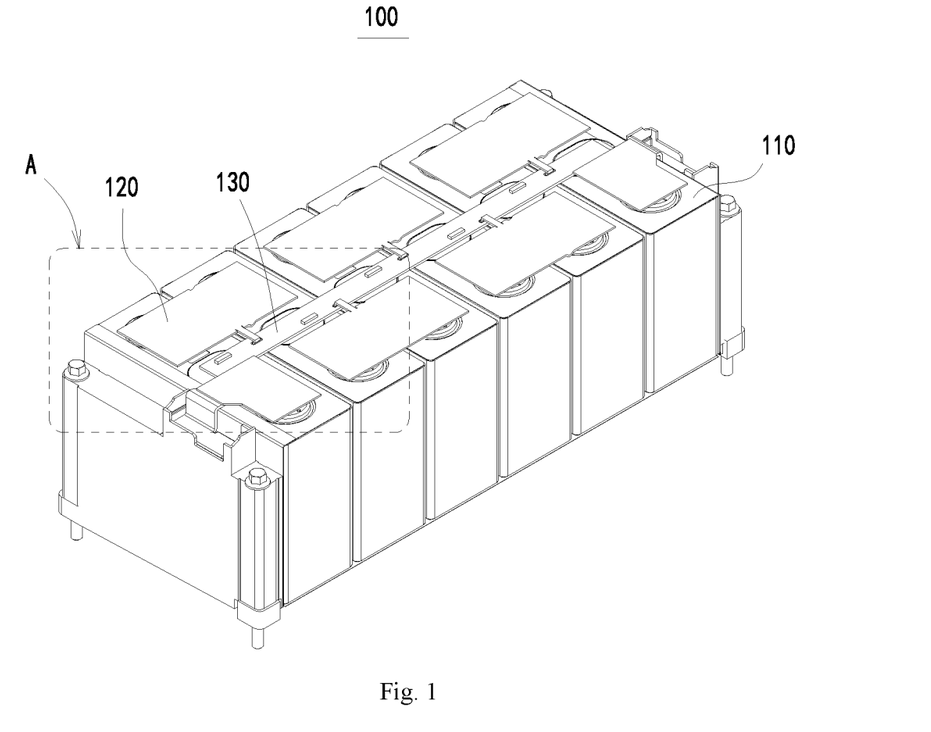
FIG. 1 is a schematic view showing an overall structure of a battery module according to an embodiment of the present disclosure.
Figure 2:
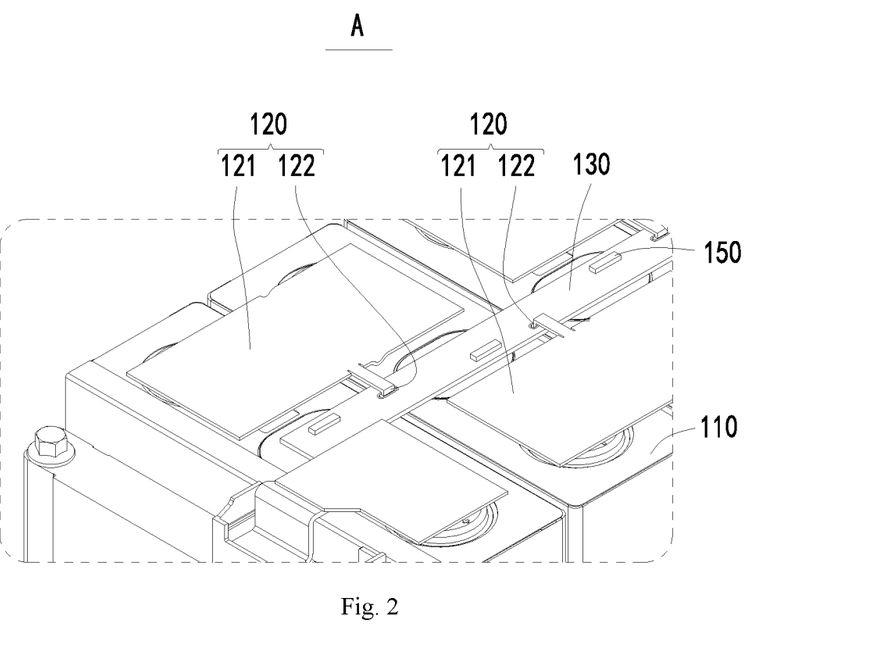
FIG. 2 is a partial enlarged view of the portion A in FIG. 1.

Referring to FIG. 1 and FIG. 2, the battery module 100 of the embodiment of the present disclosure includes a plurality of single cells 110 arranged in one direction, a busbar 120 electrically connected to the single cells 110, and a sampling circuit board 130 for sampling physical parameters of the single cells 110. Adjacent single cells 110 may be connected in series or in parallel by the busbar 120 of the embodiment. The busbar 120 is directly electrically connected to the sampling circuit board 130. The sampling circuit board 130 of the embodiment is disposed on a top of the single cells 110. The top refers to a side of the single cells 110 to be electrically connected with each other. Optionally, the sampling circuit board 130 of the embodiment may be a rigid circuit board or a flexible circuit board. The sampling circuit board 130 of the embodiment extends in the arrangement direction of the single cells 110. The sampling circuit board 130 of the embodiment has an upper surface and a lower surface opposite to each other, wherein the lower surface of the sampling circuit board 130 is disposed facing the single cells 110 when the sampling circuit board 130 is disposed on the top of the single cells 110.

Figure 3:
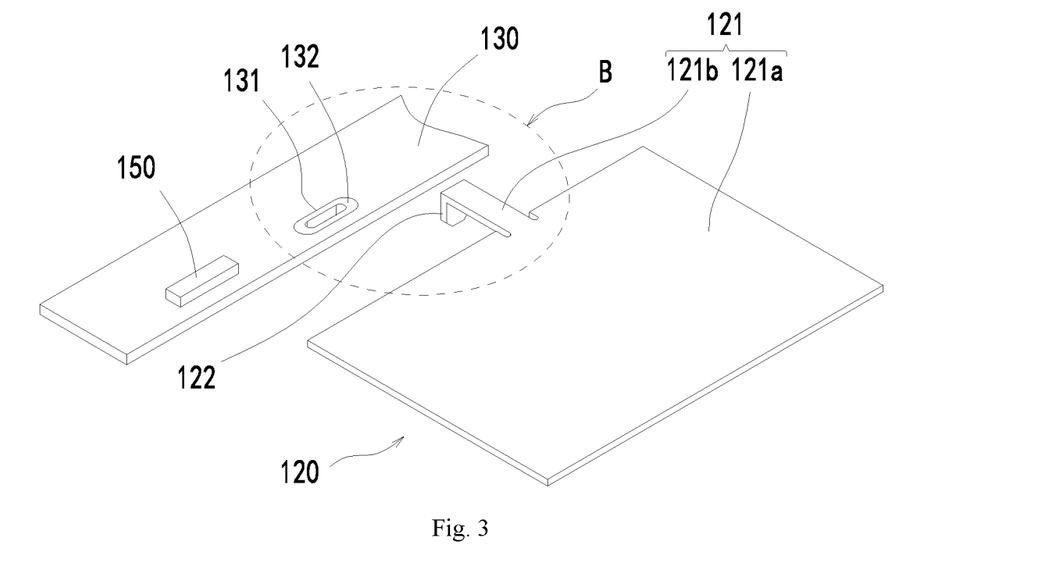
FIG. 3 is a schematic exploded view showing a busbar and a sampling circuit board according to an embodiment of the present disclosure.
Figure 4:
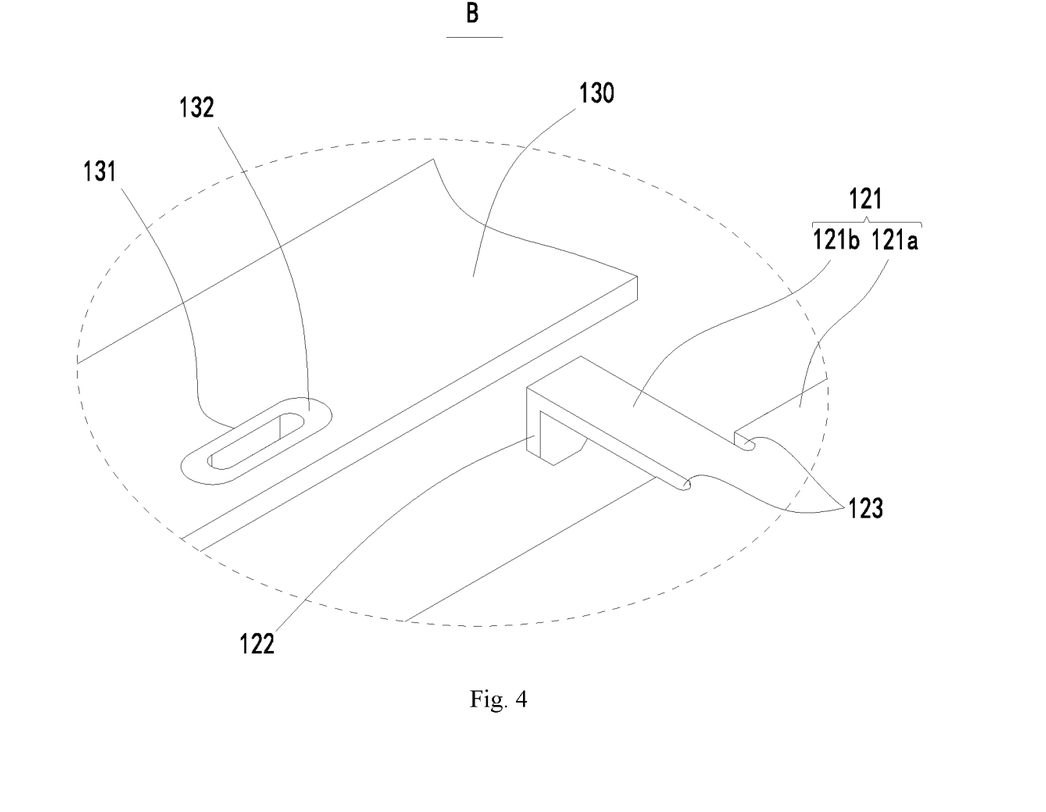
FIG. 4 is a partial enlarged view of the portion B in FIG. 3.
Figure 5:
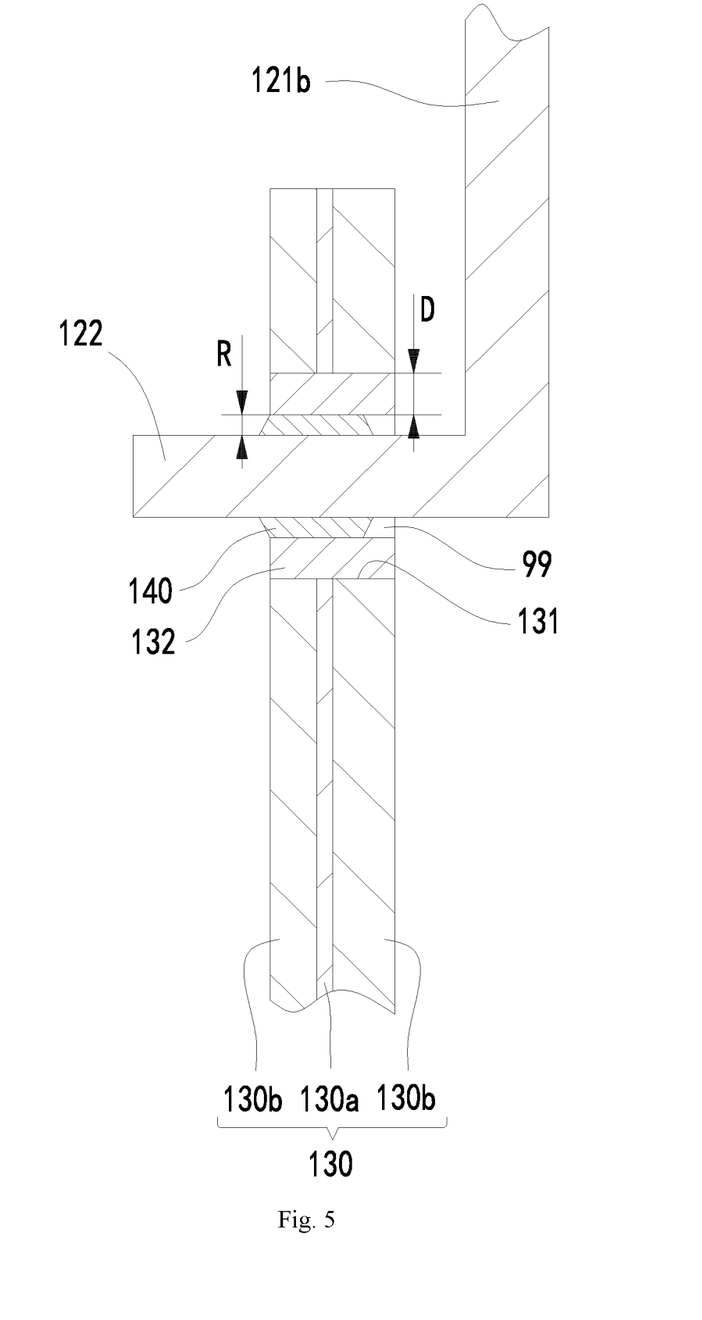
FIG. 5 is a schematic view showing a connecting structure of a busbar and a sampling circuit board according to an embodiment of the present disclosure.

Referring to FIG. 3 to FIG. 5, the sampling circuit board 130 of the embodiment includes a conductive layer 130a, an external insulating layer 130b encasing the conductive layer 130a, and a conductive hole 131 extending from the upper surface to the lower surface of the sampling circuit board 130. A section of the conductive layer 130a is exposed in the conductive hole 131, so that the section of the conductive layer 130a can be directly observed at the conductive hole 131. The sampling circuit board 130 of the embodiment further includes a conductive sleeve 132 disposed in the conductive hole 131. The conductive sleeve 132 is formed into a hollow structure with a central hole. At least a portion of the conductive sleeve 132 is disposed in the conductive hole 131 and tightly mated with the conductive hole 131. The conductive sleeve 132 and the section of the conductive layer 130a (an area of the conductive layer 130a exposed within the conductive hole 131) are tightly contacted and electrically connected with each other, thereby improving vibration resistance of the conductive sleeve 132 and ensuring stability of connection between the conductive sleeve 132 and the conductive layer 130a. Thus, the conductive sleeve 132 functions as a connecting member for the conductive layer 130a, so that the conductive layer 130a can be electrically connected to an external structural member through the conductive sleeve 132, thereby increasing a contact area of an electrical connection between the external structural member and the sampling circuit board 130.

In one embodiment, the conductive sleeve 132 and the conductive layer 130*a* are formed into an integral structure. In the embodiment, the conductive sleeve 132 is formed by electroplating in the conductive hole 131, so that the conductive sleeve 132 and the conductive layer 130*a* can be formed into an integral structure. The conductive sleeve 132 cannot displace in the conductive hole 131 along an axial direction of the conductive hole 131, so that the conductive sleeve 132 can be connected stably and reliably with the conductive layer 130*a* included in the sampling circuit board 130.

In one embodiment, the conductive sleeve 132 and the conductive layer 130*a* are formed into separated parts. The conductive sleeve 132 and the conductive hole 131 are welded to each other. During the welding, a contact area between the conductive sleeve 132 and the conductive layer 130*a* are melted. After cooling, a welded area is formed between the conductive sleeve 132 and the conductive layer 130*a*, which ensures that an outer peripheral surface of the conductive sleeve 132 and the section of the conductive layer 130*a* are engaged with each other, thereby effectively improving vibration resistance of the conductive sleeve 132. The displacement of the conductive sleeve 132 in the conductive hole 131 along the axial direction of the conductive hole 131 is less likely to occur, thereby ensuring the stability and reliability of connection between the conductive sleeve 132 and the conductive layer 130*a*.

The busbar 120 of the embodiment includes a connecting plate 121 and a conductive post 122 extending outward from the connecting plate 121. The connecting plate 121 included in the busbar 120 is used to be electrically connected to electrode terminals of the single cells 110. The conductive post 122 included in the busbar 120 is used to be inserted into the conductive sleeve 132 included in the sampling circuit board 130 so that the busbar 120 and the sampling circuit board 130 are electrically connected.

In the embodiment, the conductive post 122 included in the busbar 120 is directly electrically connected to the conductive sleeve 132 of the sampling circuit board 130. Thus, on one hand, a contact area between the conductive post 122 and the conductive sleeve 132 is large and a contact between them is tight, so that an offset or separation between the conductive post 122 and the conductive sleeve 132 is less likely to occur, and stability and vibration resistance of connection between the conductive post 122 and the conductive sleeve 132 are improved, thereby effectively ensuring stability of an electrical connection between the busbar 120 and the sampling circuit board 130 and reducing a possibility of unstable connection or open circuit between the busbar 120 and the sampling circuit board 130. On the other hand, no additional components are needed to be added between the busbar 120 and the sampling circuit board 130 to achieve an electrical connection between them. The number of connection points between the busbar 120 and the sampling circuit board 130 is effectively reduced, thus reducing a possibility of mechanical fracture failure of a connecting structure between the both, and meanwhile, it is easier to perform the connection between the busbar 120 and the sampling circuit board 130, which reduces a difficulty and cost of the connection operation between them. Further, there is no need to use a wire harness with an insulating outer layer for electrical connection between the busbar 120 and the sampling circuit board 130, and accordingly, there is no need to additionally provide a mounting plate for the wire harness or similar structures. As a result, after connection, an overall structure is compact with a smaller space occupation, which is conducive to increase an energy density of the battery module.

In one embodiment, the conductive post 122 and the central hole of the conductive sleeve 132 are assembled in an interference fit. For example, the conductive post 122 can be pressed into the central hole of the conductive sleeve 132 by being applied to a sufficient pressure. Alternatively, a cross section of the central hole of the conductive sleeve 132 is circular or polygonal, and the conductive post 122 is formed with a cross section in a shape of matching with the cross sectional of the central hole of the conductive sleeve 132, so that the central hole of the conductive sleeve 132 and the conductive post 122 can tightly mating with each other. The interference fit between the conductive post 122 and the conductive sleeve 132 can ensure that the outer peripheral surface of the conductive post 122 and the inner peripheral surface of the conductive sleeve 132 are pressed to each other, thereby effectively improving friction between them and improving a vibration resistance of a connecting area between the conductive post 122 and the conductive sleeve 132, and thus ensuring stability and reliability of connection between the conductive post 122 and the conductive sleeve 132.

In a further embodiment, referring to FIG. 5, the conductive post 122 and the conductive sleeve 132 are connected with each other by soldering. Optionally, a diameter of the conductive post 122 is smaller than that of the central hole of the conductive sleeve 132 to form a filler gap 99 with an annular cross section between the outer peripheral surface of the conductive post 122 and the inner wall of the conductive sleeve 132. The battery module 100 of the embodiment further includes a soldered body 140 formed by solder. After the conductive post 122 is inserted into a predetermined position of the central hole of the conductive sleeve 132, the filler gap 99 formed between the conductive post 122 and the inner wall of the conductive sleeve 132 is filled with a solder in a molten state. After aging treatment, the solder solidifies and forms a soldered body 140 between the conductive post 122 and the conductive sleeve 132. The conductive post 122 and the conductive sleeve 132 are connected, fixed and electrically connected by the soldered body 140. The soldered body 140 is provided to improve the strength and vibration resistance of connection between the conductive post 122 and the conductive sleeve 132. At least a portion of the soldered body 140 is provided in the filler gap 99. The above-described solder may be tin or a tin alloy, and further may be other metal materials suitable for soldering, such as copper.

The conductive sleeve 132 of the embodiment can isolate the solder at a high temperature from the sampling circuit board 130, thereby reducing a possibility that the solder at a high temperature damages the sampling circuit board 130, and ensuring that the sampling circuit board 130 is not susceptible to high temperature damage or external force impact damage so as to maintain its integrity during connecting operation between the busbar 120 and the sampling circuit board 130.

Optionally, the cross section of the central hole of the conductive sleeve 132 may be circular or polygonal, and the shape of the cross section of the conductive post 122 is formed to match with that of the central hole of the conductive sleeve 132, so that a equidistant gap can be formed between the conductive sleeve 132 and the conductive post 122. As a result, it can be ensured that a soldered region finally formed by the solder has a uniform thickness and subjects uniformly distributed force throughout itself, thereby improving the stability of connection between the conductive post 122 and the sampling circuit board 130. In one example, the central hole of the conductive sleeve 132 can be formed as a waist-shaped hole (that is, an oblong hole), and the cross section of the conductive post 122 is rectangular.

Preferably, in a radial direction of the conductive sleeve 132, a dimension R of the filler gap 99 is in a range of 0.1 mm to 0.5 mm. On one hand, it can be ensured that the molten solder can smoothly flow into the filler gap 99, reducing a possibility that it is difficult for the solder to flow into the filler gap 99 due to a surface tension of the solder in the molten state, and thus reducing a possibility that the solder deposits at an opening of the filler gap 99 causing a fail filling of the solder. On the other hand, a possibility that strength of connection between the conductive post 122 and the conductive sleeve 132 is reduced due to a large radial space between the conductive post 122 and the conductive sleeve 132 caused by an excessive gap between them, is reduced. Further, if the gap between the conductive post 122 and the conductive sleeve 132 is too large, the soldered body 140 may not fully fill the filler gap 99, resulting in generation of a false welding between the conductive post 122 and the soldered body 140, and between the conductive sleeve 132 and the soldered body 140, respectively.

In one embodiment, the soldered body 140 is provided to occupy at least 75% of the entire filler gap 99 in the axial direction of the conductive sleeve 132. In the case that the soldered body 140 occupies less than 75% of the filler gap 99, a filling amount of the soldered body 140 in the filler gap 99 is too small, which will cause an unstable connection between the conductive post 122 and the conductive sleeve 132, and a separation between the conductive post 122 and the conductive sleeve 132 may occur. Thus, by making the connecting area between the conductive post 122 and the conductive sleeve 132 provided by the soldered body 140 to be sufficiently large, a strength of connection between the conductive post 122 and the conductive sleeve 132 can be improved, effectively ensuring the stability and vibration resistance of connection between the conductive post 122 and the conductive sleeve 132.

In one embodiment, the conductive post 122 has a free end that is away from the connecting plate 121. After the conductive post 122 is inserted into the conductive sleeve 132, the free end of the conductive post 122 protrudes beyond a surface of the sampling circuit board 130. Thus, when a molten solder is infused into the filler gap 99, the free end of the conductive post 122 can direct the molten solder, so that the molten solder can smoothly flow into the filler gap 99 without overflowing to the surface of the sampling circuit board 130, which reduces a possibility that the solder falls on the surface of the sampling circuit board 130 and burns or damages the sampling circuit board 130, and effectively ensuring a structural integrity of the sampling circuit board 130.

Figure 6:
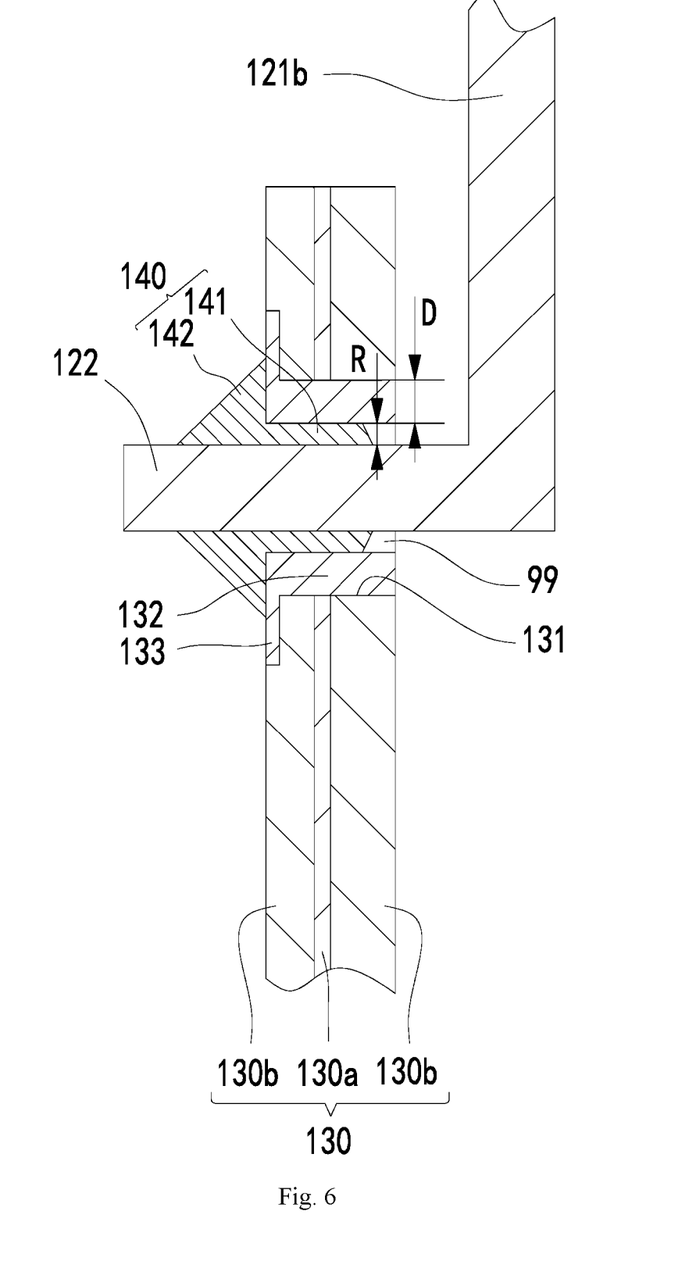
FIG. 6 is a schematic view showing a connecting structure of a busbar and a sampling circuit board according to another embodiment of the present disclosure.

Referring to FIG. 6, the sampling circuit board 130 of the embodiment further includes an annular body 133 located at an end of the conductive sleeve 132. The annular body 133 is disposed on a surface of the sampling circuit board 130 facing the single cells 110 and is provided to surround the conductive hole 131. The annular body 133 of the embodiment may be integrally formed with the conductive sleeve 132, or may be a separate structure from the conductive sleeve 132. The soldered body 140 includes a sleeve portion 141 and an annular flange 142 provided on the sleeve portion 141. The sleeve portion 141 is disposed in the filler gap 99, and the annular flange 142 is laminated with the annular body 133. Since the annular flange 142 and the annular body 133 of the conductive sleeve 132 are laminated in an axial direction of the conductive hole 131, the annular flange 142 of the soldered body 140 is pressed against the sampling circuit board 130 and thus is further limited by the sampling circuit board 130, which reduces deformation and displacement of the soldered body 140 in the axial direction of the conductive hole 131 when the battery module 100 is subjected to an external vibration and thus ensures the stability and reliability of connection between the conductive post 122 and the conductive sleeve 132.

In one embodiment, the conductive sleeve 132 has a wall thickness D greater than or equal to 0.025 mm. Thus, during an insertion of the conductive post 122 into the conductive sleeve 132, a possibility that the conductive sleeve 132 is scraped by the free end of the conductive post 122 and causing a peeling failure, can be reduced. Meanwhile, the wall thickness D of the conductive sleeve 132 is less than or equal to 1 mm. In this case, during the insertion of the conductive post 122 into the conductive sleeve 132, a possibility that the conductive sleeve 132 is scraped by the free end of the conductive post 122 and generating debris can be reduced, and an occurrence of short circuit between other electrical components due to the debris can be prevented, thereby improving safety of the battery module 100.

In one embodiment, the conductive sleeve 132 is made of copper or a copper alloy which has good electrical conductivity and makes the conductive sleeve 132 and the conductive post 122 to be easily soldered, to ensure a strong connection strength and a stable connection of the conductive sleeve 132 and the conductive post 122, thereby further reducing a possibility of mechanical fracture failure between them.

The conductive post 122 of the embodiment may be formed in a shape of prism. In one example, the central hole of the conductive sleeve 132 is formed into a waist-shaped hole (that is, an oblong hole). The cross section of the conductive post 122 is rectangular and thus the conductive post 122 is in a shape of quadrangular prism. In another example, the cross section of the central hole of the conductive sleeve 132 is polygonal, and the cross section of the conductive post 122 is also polygonal and is formed to match with the shape of the central hole of the conductive sleeve 132, so that a portion of the conductive post 122 inserted into the central hole of the conductive sleeve 132 are easily connected and tightly mating with the central hole of the conductive sleeve 132 by an interference fit, so as to improve the stability of connection between the conductive post 122 and the conductive sleeve 132.

In one embodiment, as shown in FIG. 3 and FIG. 4, the connecting plate 121 of the embodiment includes a body portion 121a and a cantilever portion 121b extending outward from the body portion 121a. The body portion 121a is used to be electrically connected to the electrode terminals of the single cells 110. The conductive post 122 is provided at a free end of the cantilever portion 121b. An end of the conductive post 122 away from the free end of the cantilever portion 121b has a top end surface 122a and a guiding bevel 122b in connection and intersecting with the top end surface 122a. The guide bevel 122b is inclined from the top end surface 122a toward the cantilever portion 121b. During an insertion of the conductive post 122 into the central hole of the conductive sleeve 132, the conductive post 122 can be inserted into the central hole of the conductive sleeve 132 more quickly and accurately under the guidance of the guiding bevel 122b. As a result, assembly time can be shorted. Moreover, a possibility that the end of the conductive post 122 and the conductive sleeve 132 are scraped by each other and thus being damaged can be reduced, and thus a possibility that the end of the conductive post 122 and the conductive sleeve 132 are scraped by each other and thus generating debris, which may cause a short circuit between other electrical components, can be reduced. Therefore, the safety of the battery module 100 can be improved.

Alternatively, the top end surface 122a may be a flat surface or an arc-shaped surface. The guiding bevel 122b may be a flat surface or an arc-shaped surface.

Figure 7:
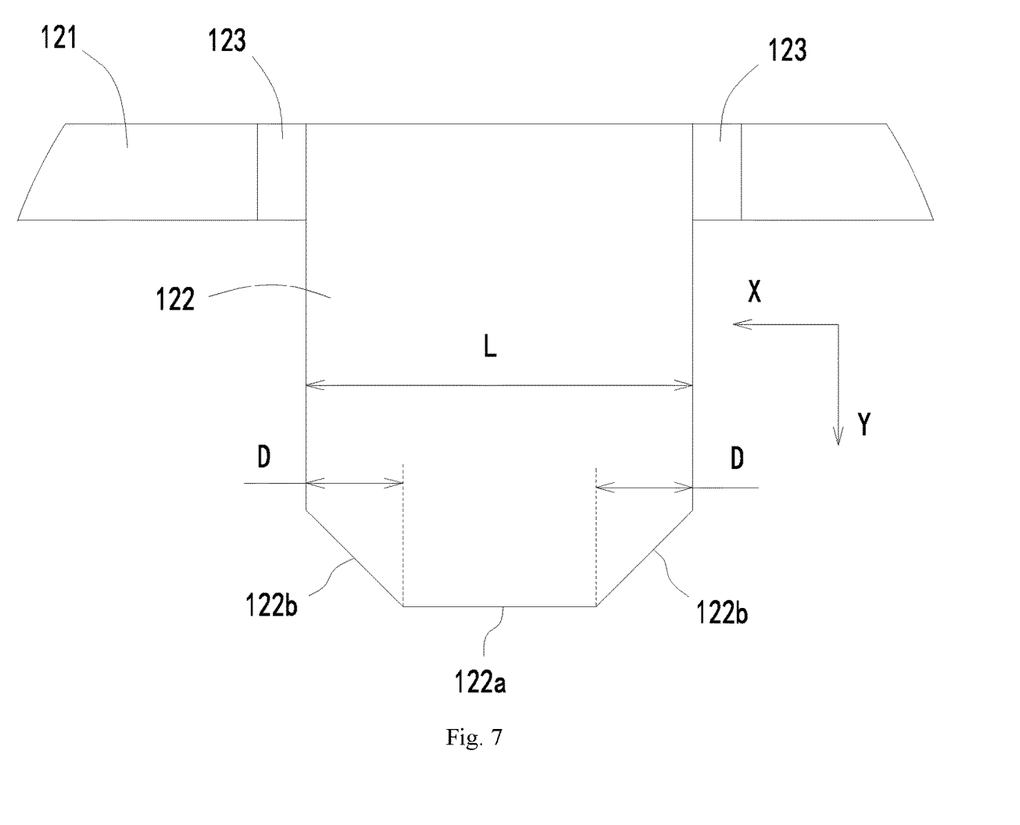
FIG. 7 is a schematic structural view of a conductive post according to an embodiment of the present view.

In one embodiment, referring to FIG. 7, the conductive post 122 has a predetermined width L. The top end surface 122a and the guiding bevel 122b of the conductive post 122 are arranged in a width direction X of the conductive post 122. The ratio of a width D of an orthographic projection of the guiding bevel 122b in an extending direction Y of the conductive post 122 to the predetermined width L of the conductive poste 122 is in a range of ¼ to ⅖. In this case, when the guiding bevel 122b of the conductive post 122 touches the sampling circuit board 130, a component force toward an axis of the central hole of the conductive sleeve 132 applied to the guiding bevel 122b by the sampling circuit board 130 is larger, which is conducive to guide the conductive post 122 to move faster toward the central hole of the conductive sleeve 132 and finally enter the central hole of the conductive sleeve 132. This can effectively reduce the times of insertion of the conductive post 122 into the central hole of the conductive sleeve 132, and further reduce the possibility that the end of the conductive post 122 and the sampling circuit board 130 are scraped and damaged by each other, or are scraped by each other to generate debris.

In one example, there are two guiding bevels 122b. The two guiding bevels 122b are respectively provided on two opposite sides of the top end surface 122a.

Referring to FIG. 4 or FIG. 7, the busbar 120 of the embodiment has a groove 123 provided between the cantilever portion 121b and the body portion 121a. In one example, there is a single groove 123. The single groove 123 is provided on one of two opposite sides of the cantilever portion 121b. In another example, there are two grooves 123, each of which is provided on each of the two opposite sides of the cantilever portion 121b. The groove 123 provided between the cantilever portion 121b and the body portion 121a, on one hand, can effectively eliminate stress concentration between the cantilever portion 121b and the body portion 121a, and on the other hand, can improve elastic deformation ability of the cantilever portion 121b. Therefore, in the case that the conductive post 122 is subjected to an external force, it is easy for the cantilever portion 121b to swing at a predetermined amplitude by self-deformation to counteract or buffer the influence of the external force, and thus reducing a possibility of a fracture failure at the connection between the cantilever portion 121b and the body portion 121a, and improving the stability and vibration resistance of connection between the conductive post 122 and the conductive sleeve 132.

In one embodiment, the connecting plate 121 and the conductive post 122 are formed into an integral structure, so that connection between the conductive post 122 and the connecting plate 121 is strong with a stronger impact resistance ability. In one example, the busbar 120 can be obtained by punching a plate-like blank.

The connecting plate 121 of the embodiment is disposed above the sampling circuit board 130, and the conductive post 122 is inserted into the conductive sleeve 132 from top to bottom. The term "from top to bottom" here also means that the conductive post 122 is moved toward the single cells 110. Thus, the sampling circuit board 130 is located between the connecting plate 121 and the single cells 110. Thus, on one hand, compared to the case where the sampling circuit board 130 is disposed above the connecting plate 121, it can be prevented that the sampling circuit board 130 is raised by the conductive post 122, being farther away from the single cells 110. As a result, a structural compactness between the sampling circuit board 130 and the single cells 110 can be better, and occupied space can be saved, which is advantageous for increasing the energy density of the battery module. On the other hand, the busbar 120 is mounted and fixed after the sampling circuit board 130 is mounted at a predetermined position on the top of the single cells 110, and thus the mounting process is optimized. Meanwhile, the conductive post 122 of the busbar 120 can limit a position of the sampling circuit board 130, which can reduce a displacement amount of upper and lower movements when the sampling circuit board 130 is subjected to an external vibration. Therefore, a possibility of mechanical fracture failure of connection between the conductive post 122 and the conductive sleeve 132 is further reduced.

The sampling circuit board 130 of the embodiment further includes a sampling circuit electrically connected to the conductive hole 131 and a fuse component 150 connected in series between the sampling circuit and the conductive hole 131. When an external short circuit of secondary battery occurs due to an external strong impact applied or a line installation error happened to the battery module 100, the fuse component 150 can automatically fuses to prevent the secondary battery from the external short-circuit state of a long time, thereby ensuring safe and stable usage of the secondary battery. In one example, the fuse component 150 can be a SMD fuse or a slim copper wire embedded in the sampling loop.

The battery module 100 of the embodiment includes a busbar 120 for electrically connecting with at least two adjacent single cells 110 and a sampling circuit board 130 for collecting parameters, such as voltage and/or temperature, of at least two adjacent single cells 110. The conductive post 122 included in the busbar 120 are indirectly electrically connected to the conductive layer 130a of the sampling circuit board 130 via the conductive sleeve 132 of the sampling circuit board 130. In this way, the contact area between the conductive post 122 and the conductive sleeve 132 of the sampling circuit board 130 is large and the conductive post 122 and the conductive sleeve 132 are tightly contacted with each other, so that offset and separation between the conductive post 122 and the conductive sleeve 132 is less likely to occur, the stability and vibration resistance of connection between the conductive post 122 and the conductive sleeve 132 can be improved, the stability of electrical connection between the busbar 120 and the sampling circuit board 130 can be ensured, and a possibility of unstable connection or disconnection between the busbar 120 and the sampling circuit board 130 can be reduced. In addition, when the battery module 100 is subjected to the external vibration, the conductive post 122 respectively included in the adjacent two busbars 120 will not move and then contact with each other, thereby avoiding an external short circuit of the secondary battery. When the battery module 100 is subjected to the external vibration, connection between the busbar 120 and the sampling circuit board 130 is still stable, thereby ensuring the reliability and safety of the battery module 100 during usage.

Although the present disclosure has been described with reference to the preferred embodiments, various modifications may be made to the present disclosure and components may be replaced with equivalents without departing from the scope of the present disclosure. In particular, the technical features mentioned in the various embodiments can be combined in any manner as long as there is no structural conflict. The present disclosure is not limited to the specific embodiments disclosed herein, but includes all technical solutions falling within the scope of the claims.

What is claimed is:

1. A battery module, comprising:
a plurality of single cells arranged in sequence;
a sampling circuit board disposed opposite to a top of the plurality of single cells and provided with a conductive hole and a conductive sleeve disposed in the conductive hole; and
a busbar having a connecting plate and a conductive post extending from the connecting plate, and the connecting plate being connected to the plurality of single cells,
wherein the busbar is electrically connected to the sampling circuit board by insertion of the conductive post into the conductive sleeve,
a filler gap is formed between an outer peripheral surface of the conductive post and an inner wall of the conductive sleeve, and the battery module further comprises a soldered body formed by solder, wherein at least a portion of the soldered body is provided in the filler gap, and the conductive post and the conductive sleeve are connected with each other by the soldered body, and
the sampling circuit board further comprises an annular body located at an end of the conductive sleeve, wherein the annular body is disposed on a surface of the sampling circuit board facing the plurality of single cells and is provided to surround the conductive hole, the soldered body comprises a sleeve portion disposed in the filler gap and an annular flange provided on the sleeve portion, and the annular flange is laminated with the annular body.

2. The battery module of claim 1, wherein a dimension of the filler gap in a radial direction of the conductive sleeve is in a range of 0.1 mm to 0.5 mm.

3. The battery module of claim 2, wherein the conductive sleeve has a wall thickness greater than or equal to 0.025 mm and less than or equal to 1 mm.

4. The battery module of claim 2, wherein the conductive sleeve is made of copper or a copper alloy.

5. The battery module of claim 2, wherein a free end of the conductive post away from the connecting plate protrudes beyond a surface of the sampling circuit board.

6. The battery module of claim 1, wherein the soldered body is configured to occupy at least 75% of the filler gap in an axial direction of the conductive sleeve.

7. The battery module of claim 1, wherein the conductive sleeve has a wall thickness greater than or equal to 0.025 mm and less than or equal to 1 mm.

8. The battery module of claim 1, wherein the conductive sleeve is made of copper or a copper alloy.

9. The battery module of claim 1, wherein a free end of the conductive post away from the connecting plate protrudes beyond a surface of the sampling circuit board.

10. The battery module of claim 1, wherein the connecting plate is disposed above the sampling circuit board, and the conductive post is inserted into the conductive sleeve from top to bottom.

11. The battery module of claim 1, wherein the conductive post is formed in a shape of prism, and has a top end surface and a guiding bevel in connection and intersecting with the top end surface.

* * * * *